United States Patent [19]

Chen

[11] 4,120,046
[45] Oct. 10, 1978

[54] TWO DIMENSIONAL STRETCHER DETECTOR

[75] Inventor: Thomas T. Chen, Yorba Linda, Calif.

[73] Assignee: Rockwell International Corporation, El Segundo, Calif.

[21] Appl. No.: 831,034

[22] Filed: Sep. 6, 1977

[51] Int. Cl.² .......................................... G11C 19/08
[52] U.S. Cl. ...................................... 365/8; 365/12; 365/43
[58] Field of Search ............................ 365/12, 8, 43

[56] References Cited

U.S. PATENT DOCUMENTS 3,922,652  11/1975  Sandfort et al. ...................... 365/12

OTHER PUBLICATIONS

IEEE Transactions on Magnetics, vol. Mag-9, No. 3, Sep. 1973, pp. 493-495.

Primary Examiner—James W. Moffitt
Attorney, Agent, or Firm—H. Fredrick Hamann; G. Donald Weber, Jr.

[57] ABSTRACT

There is described a magnetic bubble domain device particularly adapted for bubble domain detection. A bubble is supplied via a standard input propagation path, expanded to an elongated bubble comfiguration and replicated into a plurality of bubbles. The plurality of bubbles propagate along a respective plurality of propagation paths and reach a detector portion, preferrably at different times. The detector portion is arranged to receive bubbles along the respective plurality of paths and to produce enlarged bubbles representative of each of the bubbles replicated from the original bubble. Consequently, the original bubble has been enlarged by elongation and by replication wherein detection of the original bubble is enhanced.

11 Claims, 3 Drawing Figures

TWO DIMENSIONAL STRETCHER DETECTOR

BACKGROUND OF THE INVENTION

1. Field of the Invention

This invention is directed to magnetic bubble domain devices, in general, and to a magnetic bubble domain detection device, in particular.

2. Prior Art

Magnetic bubble domains and applications thereof are known in the art. Applications and devices for utilization of an operation on magnetic bubble domains have been and still are undergoing investigation, analysis, study and development. One of the devices which is essential to magnetic bubble domain system applications is, of course, detectors. Many types of detectors are known in the art. Detectors of known configuration include single level devices in which zig zag configurations, herringbone configurations or the like are provided. In addition, in multiple level devices magnetoresistive material is overlaid relative to magnetic bubble domain propagation paths. All of the known detector devices have the primary purpose of detecting the passage of a magnetic bubble domain past the detection station. Various approaches have been used such as amplifying a signal from a magnetoresistive device, connecting a herringbone and zig zag arrangements to form an elongated bubble which can be more readily detected and the like. However, all of the known devices are still relatively sensitive to noise and produce relatively small output signals. Consequently, the reliability and accuracy thereof remains a problem.

SUMMARY OF THE INVENTION

The detector device described herein operates on a standard magnetic bubble domain which is propagating through any suitable magnetic bubble domain system. The bubble is initially elongated and replicated into a plurality of separate bubbles. The plurality of separate bubbles is propagated through a respective plurality of propagation paths each of which preferrably has a different length. The plurality of propagation paths is merged into a detection station which comprises a plurality of devices wherein the bubbles from each of the plurality of propagation paths is again elongated. Inasmuch as each of the bubbles is elongated from the respective propagation path and arrives at a different time, a plurality of substantially parallel, elongated bubbles is provided. Consequently, a relatively large, two dimensional, bubble (or bubble area) is provided. Thus, the detection of the initial bubble is substantially enhanced.

DESCRIPTION OF THE PREFERRED EMBODIMENT

Figure 1:
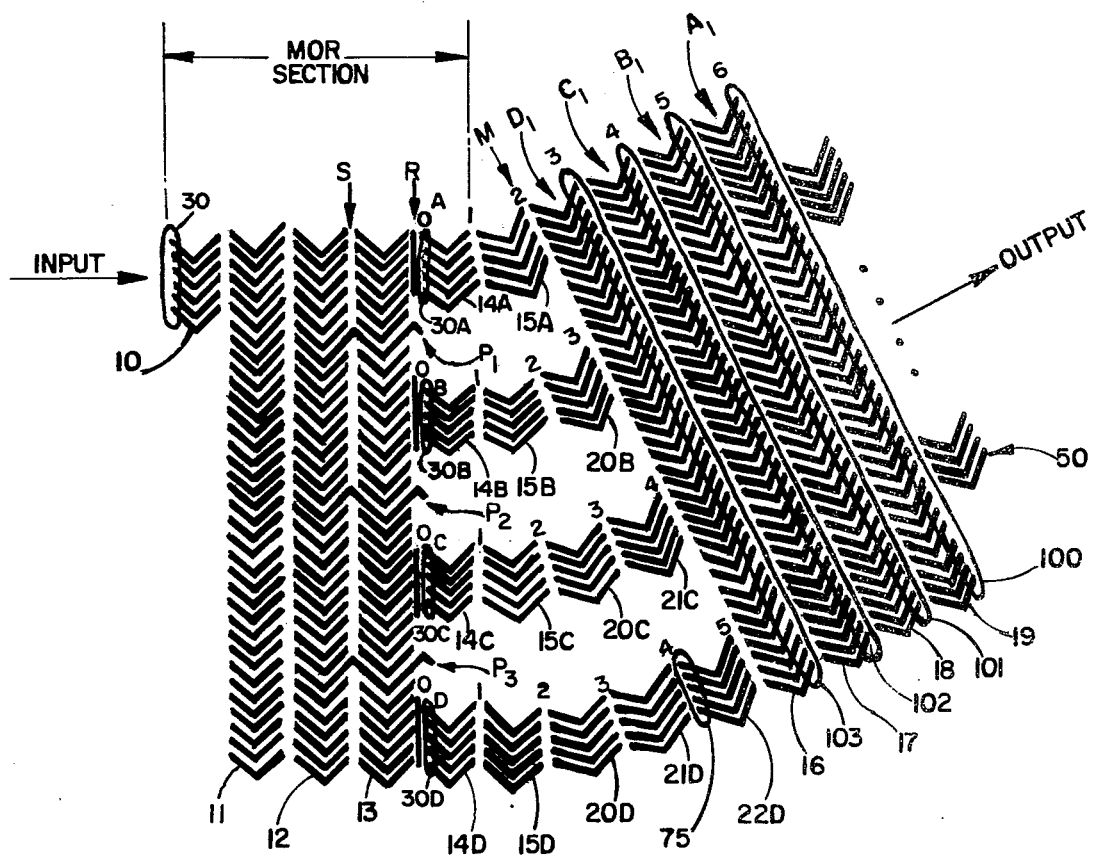
FIG. 1 is a schematic representation of a two dimensional magnetic bubble domain detector using chevron configuration devices.

Referring now to FIG. 1, there is shown a preferred embodiment of the instant invention. In this embodiment, the magnetic bubble domain device components are shown as chevrons. Of course, any other modified chevron or other similar component can be utilized.

Initially, a bubble to be detected is supplied at the input to the device as indentified by chevron column 10. The bubble propagates through column 10 and is transferred to column 11 and column 12 under the influence or rotating field $H_R$ in accordance with typical procedures. As the bubble progresses from chevron column 10 to chevron column 11 and chevron column 12, the bubble becomes elongated and is stretched along the entire length of the chevron column.

When the bubble is transferred or propagated through chevron column 13, i.e. towards the right end thereof, the bubble is passively replicated into a plurality of individual bubbles in accordance with the technique described in Bubble Domain Circuit Organization, U.S. Pat. No. 4,032,905, to T. Chen, as well as the art cited therein. Further reference is made to Nelson, "Progress in All Permalloy Bubble Control Functions", AIP Conference Proceedings, No. 18, p. 95, 1973. As a consequence of the multiple output replicator (MOR) operation, bubbles are applied to the left ends of chevron columns 14A, 14B, 14C and 14D. This position is, for descriptive purposes, considered time period or position 0.

As field $H_R$ rotates, the bubbles are substantially simultaneously propagated through columns 14A, 14B, 14C and 14D to position 1 which is the left end of the chevrons in columns 15A, 15B, 15C and 15D. Again, through further operation of rotating field $H_R$ the bubbles propagate through chevron columns 15A, 15B, 15C and 15D until they are attracted to the left ends of the next chevron column which are identified as position 2. In the case of propagation path A, the bubbles are transferred to the left ends of chevron column 16 and expanded therealong. In each of the other propagation paths, the bubble is transferred to the left ends of chevron columns 20B, 20C and 20D. The propagation continues, in response to rotating field $H_R$ until the bubble in path B is transferred to chevron column 16 at time period 3; the bubble is transferred from path C to column 16 at time period 4; and the bubble is transferred to column 16 from path D at time period 5. Meanwhile, during time periods 3, 4, and 5, the bubbles previously transferred to and enlarged by column 16 are sequentially propagated to chevron columns 17, 18, 19 and 50. Thus, at time period 6, it is apparent that the original bubble has been replicated into a plurality of bubbles all of which have been expanded to the full length of the detection columns (i.e. columns 16, 17, 18, 19) and disposed at the right ends of each of the chevron columns as bubbles 100, 101, 102, and 103, respectively. It is clear that the relatively small bubble at the input now has been stretched in two dimensions and provides a large bubble area which can be detected readily during a detection cycle.

Figure 2:
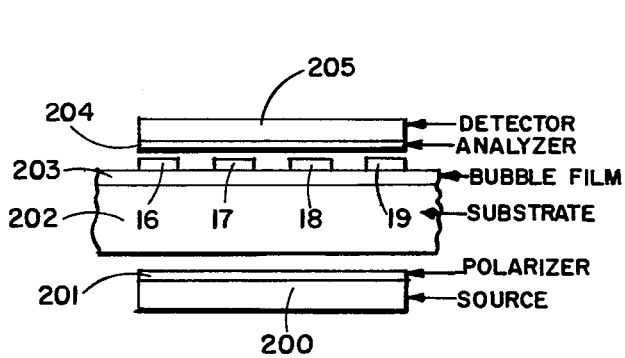
FIG. 2 is a schematic representation of an optical detector for use with the device shown in FIG. 1.

Referring now to FIG. 2, there is shown an optical detector for use with the detector shown in FIG. 1. This optical detector is a schematic representation only. However, the detector may comprise a radiation source 200 such as a light emitting diode (LED). A polarizer 200 is provided, if necessary, to control the radiation emitted by source 200. Substrate 202 which may be any suitable material, such as typical garnet, and which is transparent to the radiation from source 200 supports bubble film 203 which is deposited on substrate 202 in typical fashion. Again, bubble film 203 has transparency which is a function of the bubble status therein as is known in the art. Schematically represented on bubble film 203 are chevron columns 16, 17, 18 and 19 which form the detector portion as shown in FIG. 1. A detector 205 which is sensitive to the radiation emitted by source 200 is arranged to receive radiation which is controlled by (or a function of) the bubbles at chevron columns 16 through 19. An analyzer film 204 may be provided on detector 205 if desirable.

In another embodiment now specifically shown, a reflective mode can be utilized. In this mode, the source and detector are arranged on the same side of the bubble domain composite. Typically, source 200 and detector 205 are disposed on the side of substrate 202 which is away from bubble film 203. This arrangement avoids the interference which can be produced by the permalloy pattern.

Clearly, with the optical detector a greater accuracy and reliability can be obtained in detecting or reading a bubble when the bubble area is stretched in two directions as suggested in FIG. 1 as compared to the area of a bubble as indicated by the input bubble in FIG. 1. In addition, light can scan many detectors at very high rates ($>10^6$ Hz) thereby improving chip access time by several orders of magnitude.

Figure 3:
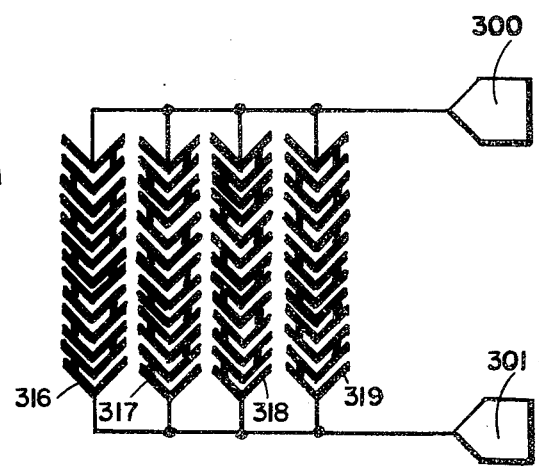
FIG. 3 is a schematic representation of a single level detector device for use with the device shown in FIG. 1.

Referring to FIG. 3, there is shown a single lever detector scheme which can be utilized with a device shown in FIG. 1. In FIG. 3, chevron columns 316, 317, 318 and 319 are representative of chevron columns 16 through 19 of FIG. 1. Each of these chevron columns is connected together by short interconnecting stub elements to form a zig zag or herringbone detector scheme as is known in the art. The common connectors in columns 316 through 319 are connected together at common points. The common points are connected to terminals 300 and 301 which are connected to a suitable detecting device (not shown) such as is known in the art. Again, it is clear that the multiple, elongated bubbles will enhance the detection capability relative to magnetic bubbles.

The magneto resistance detector of FIG. 3 is equivalent to four detectors connected in parallel. If each detector has an internal impedance Z and a signal $\Delta V$ thereacross, the total signal is still $\Delta V$, but the total impedance is Z/4. This reduction in impedance will reduce the pick up noise in the sensing circuit which is highly advantageous.

Of course, this detector arrangement also requires the data bubbles to be spaced apart by a number of cycles equal to the number of parallel detector branches. In the example shown the data bubbles (e.g. at Input) should be spaced by at least four cycles or periods.

Thus, there has been shown and described a magnetic bubble domain detecting device wherein magnetic bubbles are elongated and replicated to form an output bubble which is stretched in two dimensions relative to the input bubble such that the detection of the output bubble is enhanced. For example, two dimensional stretching increases the effective area of a data bubble. Thus, the interaction between the bubble domain and other forms of energy such as electromagnetic wave (light or microwave), acoustical wave or the like can be enhanced. It is clear that other configurations can be conceived and may be apparent to those skilled in the art. For example, the propagation path between the multiple output replicator and the multiple column detector can be intertwined in order to maintain the detector and the replicator in a substantially linear pattern rather than in the arcuate pattern shown. Conversely, the propagation path can be formed of elements with different periods in order to effect the linear pattern. In addition, as suggested supra, it is conceivable that elements other than chevrons, such as modified chevrons or other totally different elements can be utilized in this device. Also, a conductor can be utilized to change the passive MOR - to an active-type device if desired. However, so long as the device functions in the manner described hereinabove, the type of component or element is to be included as well. The description hereof is intended to be illustrative only and is not intended to be limitative. Rather, this description is limited only by the claims appended hereto.

Having thus described a preferred embodiment of the invention, what is claimed is:

1. A magnetic bubble domain detection device comprising,
   input means for receiving a magnetic bubble domain,
   replicator means for producing a plurality of magnetic bubble domains in response to a magnetic bubble domain at said input means,
   a plurality of propagation paths for receiving the magnetic bubble domains from said replicator means, and
   a plurality of common propagation devices for receiving the magnetic bubble domains from each of said plurality of propagation paths,
   said plurality of propagation paths are arranged to transfer bubbles from said replicator means to said plurality of common propagation devices in different time periods.

2. The detection device recited in claim 1 wherein
   said replicator means includes
   an elongated column of chevrons, and
   a plurality of shorter columns of chevrons disposed adjacent to said elongated column of chevrons.

3. The detection device recited in claim 1 wherein
   the number of propagation devices is equal to or greater than the number of propagation paths.

4. The detection device recited in claim 1 including
   energy source means disposed adjacent said plurality of propagation devices, and
   detector means disposed adjacent said plurality of propagation devices to receive energy from said energy source means as a function of magnetic bubble domains stored thereat.

5. The detection device recited in claim 1 including
   common detector means connected to each of said plurality of common propagation devices to detect magnetic bubble domains thereat.

6. The detection device recited in claim 1 wherein said plurality of propagation paths each have different propagation lengths.

7. The detection device recited in claim 6 wherein
   said plurality of propagation paths comprise separate columns of chevrons and each of said paths has a different number of columns of chevrons therein.

8. A detection device recited in claim 1 wherein said replicator means, said propagation paths, and said propagation devices all comprise chevron elements.

9. The detection device recited in claim 1 wherein said common propagation devices are interconnected, in parallel, to a common detector means.

10. The detection device recited in claim 1 wherein each of said plurality of propagation paths includes propagation device patterns of similar configuration.

11. A method of detecting magnetic bubble domains comprising the steps of:

providing an initial magnetic bubble domain to be detected;

replicating said initial magnetic bubble domain into a plurality of representative magnetic bubble domains;

propagating said representative magnetic bubble domains to a detection station so that the representative magnetic bubble domains arrive at said detection station at different times;

enlarging each of said representative magnetic bubble domains at said detection station; and sensing the enlarged representative magnetic bubble domains when they have all reached said detection station.

* * * * *